(12) United States Patent
Pentakota et al.

(10) Patent No.: US 11,316,525 B1
(45) Date of Patent: Apr. 26, 2022

(54) LOOKUP-TABLE-BASED ANALOG-TO-DIGITAL CONVERTER

(71) Applicant: Texas Instruments Incorporated, Dallas, TX (US)

(72) Inventors: Visvesvaraya Appala Pentakota, Bengaluru (IN); Narasimhan Rajagopal, Chennai (IN); Chirag Chandrahas Shetty, Thane (IN); Prasanth K, Ottapalam (IN); Neeraj Shrivastava, Bengaluru (IN); Eeshan Miglani, Chhindwara (IN); Jagannathan Venkataraman, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/158,526

(22) Filed: Jan. 26, 2021

(51) Int. Cl.
  *H03M 1/10* (2006.01)
  *H03M 1/66* (2006.01)
  *H03M 1/12* (2006.01)

(52) U.S. Cl.
  CPC ....... *H03M 1/1019* (2013.01); *H03M 1/1245* (2013.01); *H03M 1/662* (2013.01)

(58) Field of Classification Search
  CPC ... H03M 1/1245; H03M 1/662; H03M 1/1019
  USPC ........................................ 341/120, 155, 144
  See application file for complete search history.

(56) References Cited

U.S. PATENT DOCUMENTS

| | | | |
|---|---|---|---|
| 4,612,533 A | * | 9/1986 | Evans ................. H03M 1/1047 341/120 |
| 4,899,071 A | | 2/1990 | Morales |
| 4,928,103 A | | 5/1990 | Lane |
| 5,317,721 A | | 5/1994 | Robinson |
| 5,495,247 A | | 2/1996 | Yamamoto et al. |
| 5,563,533 A | | 10/1996 | Cave et al. |

(Continued)

FOREIGN PATENT DOCUMENTS

| JP | H05206801 | 8/1993 |
|---|---|---|
| KR | 20000028857 | 5/2000 |

(Continued)

OTHER PUBLICATIONS

U.S. Appl. No. 16/517,796, Notice of Allowance, dated Feb. 6, 2020, p. 7.

(Continued)

*Primary Examiner* — Peguy Jean Pierre
(74) *Attorney, Agent, or Firm* — Mark Allen Valetti; Charles A. Brill; Frank D. Cimino

(57) ABSTRACT

An analog-to-digital converter system includes a digital-to-analog converter for generating calibration voltages based on digital input codes, and an analog-to-digital converter, connected to the digital-to-analog converter, for receiving the calibration voltages from the digital-to-analog converter, for receiving sampled voltages, for generating digital output codes based on the calibration voltages, and for generating digital output codes based on the sampled voltages. The analog-to-digital converter system may have a lookup table, connected to the analog-to-digital converter, for storing the first digital output codes in association with the digital input codes. A method of calibrating an analog-to-digital converter system is also disclosed.

18 Claims, 7 Drawing Sheets

(56) References Cited

U.S. PATENT DOCUMENTS

| | | | |
|---|---|---|---|
| 5,821,780 | A | 10/1998 | Hasegawa |
| 6,002,352 | A | 12/1999 | El-Ghoroury et al. |
| 6,046,612 | A | 4/2000 | Taft |
| 6,069,579 | A | 5/2000 | Ito et al. |
| 6,124,746 | A | 9/2000 | Van Zalinge |
| 6,144,231 | A | 11/2000 | Goldblatt |
| 6,314,149 | B1 | 11/2001 | Daffron |
| 6,377,200 | B1 | 4/2002 | Lee |
| 6,822,596 | B2 | 11/2004 | Theiler |
| 6,836,127 | B2 | 12/2004 | Marshall |
| 7,046,179 | B1 * | 5/2006 | Taft ............... H03M 1/1009 341/118 |
| 7,233,172 | B2 | 6/2007 | Kanamori et al. |
| 7,262,724 | B2 | 8/2007 | Hughes et al. |
| 7,379,007 | B2 | 5/2008 | Noguchi |
| 7,405,689 | B2 | 7/2008 | Kernahan et al. |
| 7,501,862 | B2 | 3/2009 | Su et al. |
| 7,525,471 | B2 | 4/2009 | Prodic et al. |
| 7,557,746 | B1 | 7/2009 | Waltari |
| 7,737,875 | B2 | 6/2010 | Waltari et al. |
| 7,738,265 | B2 | 6/2010 | Trattler |
| 7,847,576 | B2 | 12/2010 | Koiima |
| 7,916,064 | B2 | 3/2011 | Lin et al. |
| 7,919,994 | B2 | 4/2011 | Walker |
| 8,089,388 | B2 | 1/2012 | Cui et al. |
| 8,130,130 | B2 | 3/2012 | Danjo et al. |
| 8,183,903 | B2 | 5/2012 | Glass et al. |
| 8,373,444 | B2 | 2/2013 | Lee et al. |
| 8,421,664 | B2 | 4/2013 | Ryu et al. |
| 8,773,169 | B2 | 7/2014 | Dinc et al. |
| 8,836,375 | B2 | 9/2014 | Ghatak |
| 8,896,476 | B2 | 11/2014 | Harpe |
| 9,369,137 | B2 | 6/2016 | Masuko |
| 9,455,695 | B2 | 9/2016 | Kull et al. |
| 9,467,160 | B2 | 10/2016 | Chang |
| 9,685,971 | B2 | 6/2017 | Harada |
| 9,742,424 | B2 | 8/2017 | Sharma et al. |
| 9,917,590 | B2 | 3/2018 | Zhang et al. |
| 10,003,353 | B2 | 6/2018 | Kris et al. |
| 10,284,188 | B1 | 5/2019 | Soundarajan et al. |
| 10,673,452 | B1 | 6/2020 | Soundararajan et al. |
| 10,673,453 | B1 | 6/2020 | Pentakota et al. |
| 10,673,456 | B1 | 6/2020 | Dusad et al. |
| 10,778,243 | B2 | 9/2020 | Pentakota et al. |
| 10,958,258 | B2 | 3/2021 | Soundararajan et al. |
| 2005/0104626 | A1 | 5/2005 | Wakamatsu et al. |
| 2006/0158365 | A1 | 7/2006 | Kernahan et al. |
| 2008/0297381 | A1 | 12/2008 | Kernahan et al. |
| 2009/0302888 | A1 | 12/2009 | Shumarayev et al. |
| 2010/0085101 | A1 | 4/2010 | Walker |
| 2012/0105264 | A1 | 5/2012 | Ryu et al. |
| 2012/0176158 | A1 | 7/2012 | Lee et al. |
| 2012/0212358 | A1 | 8/2012 | Shi et al. |
| 2013/0009796 | A1 | 1/2013 | Sakiyama et al. |
| 2013/0021118 | A1 | 1/2013 | Kabir et al. |
| 2013/0169463 | A1 * | 7/2013 | Stein ............... H03M 1/12 341/155 |
| 2014/0361917 | A1 | 12/2014 | Matsuno et al. |
| 2015/0008894 | A1 | 1/2015 | Cannankurichi et al. |
| 2015/0244386 | A1 | 8/2015 | El-Chammas |
| 2015/0260552 | A1 * | 9/2015 | Yao ............... G01R 31/005 702/85 |
| 2019/0007071 | A1 | 1/2019 | Nagarajan et al. |
| 2019/0280703 | A1 | 9/2019 | Naru et al. |
| 2020/0195268 | A1 | 6/2020 | Soundararajan et al. |
| 2020/0204184 | A1 | 6/2020 | Rattan |

FOREIGN PATENT DOCUMENTS

| | | |
|---|---|---|
| KR | 2001044806 | 2/2001 |
| KR | 20020015863 | 3/2002 |

OTHER PUBLICATIONS

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

* cited by examiner

LOOKUP-TABLE-BASED ANALOG-TO-DIGITAL CONVERTER

BACKGROUND

An analog-to-digital (A/D) converter (ADC) may be used to generate digital codes which represent an analog signal. An analog-to-digital converter for digitizing a signal in a radio-frequency sampling receiver may be required to operate at high speed. Analog-to-digital converters are described in United States Patent Application Publications Nos. 2012/0212358 (Shi et al.), 2015/0244386 (El-Chammas), 2019/0007071 (Nagarajan et al.) and 2019/0280703 (Naru et al.).

Some analog-to-digital converters have one or more voltage-to-delay (V2D) components and operate, at least in part, in a delay domain. Delay-based analog-to-digital converters are described in U.S. patent application Ser. No. 16/217,643 (Soundararajan et al., filed Dec. 12, 2018) (U.S. Pub 2020/0195268 (Jun. 18, 2020)), Ser. No. 16/410,698 (Dusad et al., filed May 13, 2019) (U.S. Pat. No. 10,673,456 (Jun. 2, 2020)), and Ser. No. 16/517,796 (Pentakota et al., filed Jul. 22, 2019) (U.S. Pat. No. 10,673,453 (Jun. 20, 2020)). The entire disclosures of U.S. patent application Ser. Nos. 16/217,643, 16/410,698 and 16/517,796 are incorporated herein by reference. In addition, the entire disclosures of the five U.S. patent applications identified below in Table 1 are incorporated herein by reference. Delay-based analog-to-digital converters may be operated, if desired, at high speed, with reduced area and power requirements.

TABLE 1

| Docket No. | Title | Inventors | Serial No. |
|---|---|---|---|
| TI-91409 | PIECEWISE CALIBRATION FOR HIGHLY NON-LINEAR MULTI-STAGE ANALOG-TO-DIGITAL CONVERTER | Narasimhan Rajagopal, Visvesvaraya Pentakota and Eeshan Miglani | 17/126,157 |
| TI-91426 | DIFFERENTIAL VOLTAGE-TO-DELAY CONVERTER WITH IMPROVED CMMR | Prasanth K, Eeshan Miglani, Visvesvaraya Appala Pentakota, Kartik Goel, Jagannathan Venkataraman and Sai Aditya Nurani | |
| TI-91427 | DELAY FOLDING SYSTEM AND METHOD | Eeshan Miglani, Visvesvaraya Pentakota and Chirag Chandrahas Shetty | 17/129,180 |
| TI-91430 | SAMPLING NETWORK WITH DYNAMIC VOLTAGE DETECTOR FOR DELAY OUTPUT | Eeshan Miglani, Visvesvaraya Pentakota and Jagannathan Venkataraman | 17/131,981 |
| TI-91450 | GAIN MISMATCH CORRECTION FOR VOLTAGE-TO-DELAY PREAMPLIFIER ARRAY | Narasimhan Raj agopal, Chirag Shetty, Neeraj Shrivastava, Prasanth K and Eeshan Miglani | 17/133,745 |

SUMMARY

The present disclosure relates to an analog-to-digital converter system which has, among other things, a digital-to-analog converter for generating calibration voltages based on digital input codes, and an analog-to-digital converter, connected to the digital-to-analog converter, for receiving the calibration voltages from the digital-to-analog converter, for receiving sampled voltages, for generating digital output codes based on the calibration voltages, and for generating digital output codes based on the sampled voltages.

The present disclosure also relates to a lookup-table-based analog-to-digital converter system, where the system has, among other things, a digital-to-analog converter for generating calibration voltages based on digital input codes, an analog-to-digital converter, connected to the digital-to-analog converter, for receiving the calibration voltages, for receiving sampled voltages, for generating first digital output codes based on the calibration voltages, and for generating second digital output codes based on the sampled voltages, and a lookup table, connected to the analog-to-digital converter, for storing the first digital output codes in association with the digital input codes.

The present disclosure also relates to a method of calibrating an analog-to-digital converter system. The method includes causing a digital-to-analog converter to generate calibration voltages based on digital input codes, causing an analog-to-digital converter to receive the calibration voltages from the digital-to-analog converter, to generate first digital output codes based on the calibration voltages, and to generate second digital output codes based on sampled voltages, and storing the first digital output codes in association with the digital input codes in a lookup table

DETAILED DESCRIPTION

Figure 1:
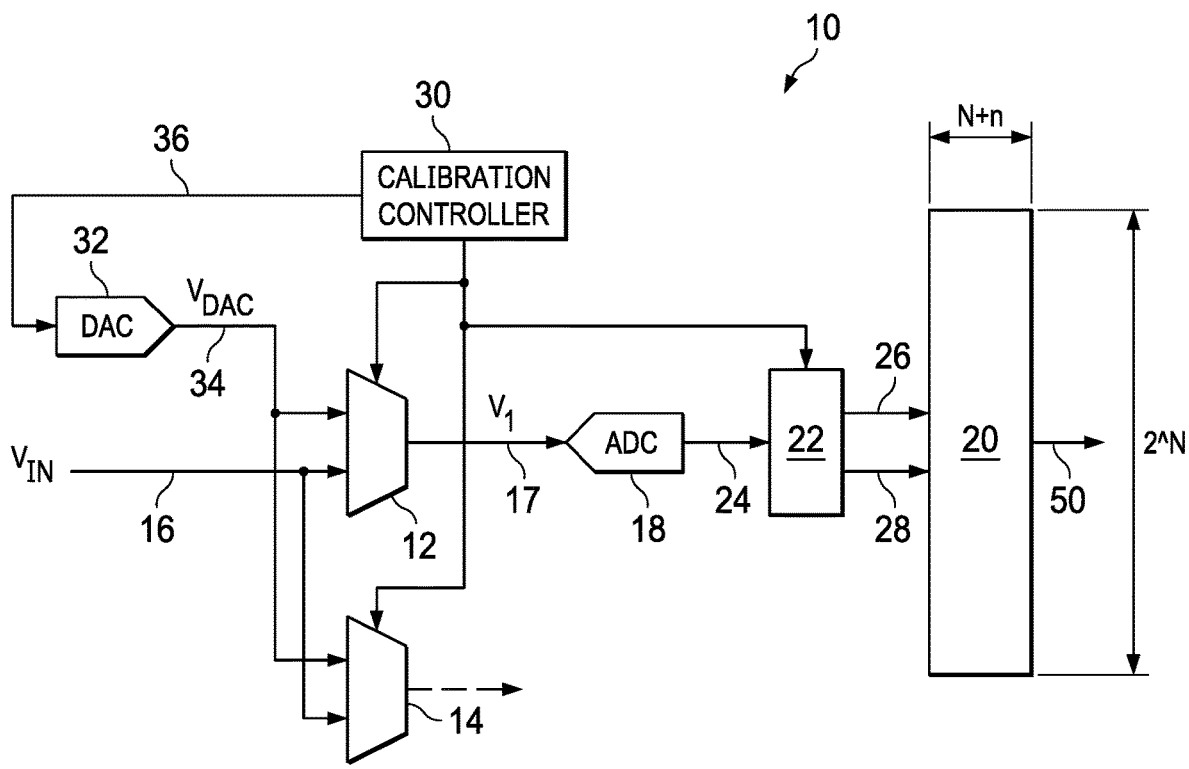
FIG. 1 is a block diagram of a delay-based analog-to-digital converter system.

FIG. 1 illustrates an analog-to-digital converter system 10 constructed in accordance with the present disclosure. The system 10 has at least first and second multiplexers 12 and 14, which may be analog multiplexers, for receiving sampled voltages $V_{IN}$ on an input line 16, an analog-to-digital converter 18 for receiving output voltages $V_1$ from the first multiplexer 12, on line 17, and a lookup table (LUT)

Figure 4:
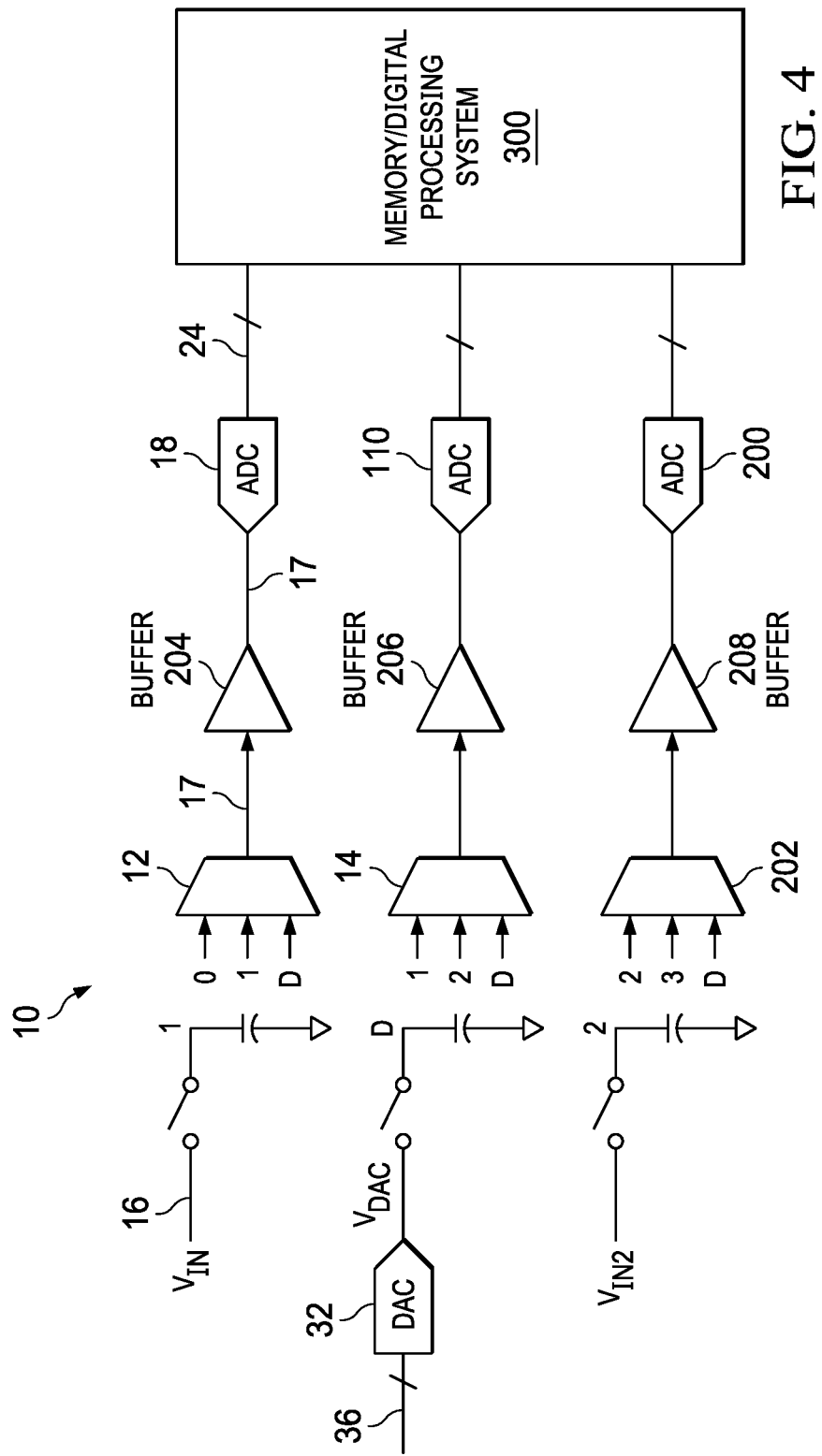
FIG. 4 is a block diagram of the analog-to-digital converter system of FIG. 1, showing three analog-to-digital converters arranged in parallel.

20. As described in more detail below, the lookup table 20 may be constructed of digital memory circuits, and may constitute one or more parts of a memory/digital processor system 300 (FIG. 4). The lookup table 20 is populated in a calibration mode. The populated table 20 is then used as an information resource in an analog-to-digital conversion (or mission) mode.

The analog-to-digital converter system 10 also has a third multiplexer 22 (FIG. 1), which may be a digital multiplexer, for receiving digital codes from the analog-to-digital converter 18, on line 24, and for applying the digital codes to the lookup table 20. As described in more detail below, the third multiplexer 22 operates in the calibration and analog-to-digital conversion (or mission) modes on write and read paths 26 and 28, respectively. The first and second multiplexers 12 and 14 and the third multiplexer 22 are operated by a calibration controller 30. A digital-to-analog (D/A) converter (DAC) 32 is also operated by the calibration controller 30. The digital-to-analog converter 32 applies calibration voltages $V_{DAC}$ to the first and second multiplexers 12 and 14 on line 34. The calibration voltages $V_{DAC}$ are generated by the digital-to-analog converter 32 based on digital input codes 100 (FIG. 2) applied to the digital-to-analog converter 32 (FIG. 1) by the calibration controller 30, on line 36.

The first multiplexer 12, the analog-to-digital converter 18, and the third multiplexer 22 may be operated together in the calibration mode, and in the analog-to-digital conversion mode. In the calibration mode, the calibration controller 30 issues a series of $2^N$ ($2^N$) digital codes 100 (FIG. 2) on line 36 (FIG. 1) to cause the digital-to-analog converter 32 to apply a corresponding series of $2^N$ different voltages, $V_{DAC}=Vr/(2^N)$, on line 34. Here, Vr is the input range from the lowest value to the highest value of the sampled voltages $V_{IN}$ expected to be sampled and input on line 16, and N-bits is the resolution of the first analog-to-digital converter 18. Hence, for example, if $V_{IN}$ is expected to be in range of from 0 V to 5 V, Vr would be a value around 5 V.

Figure 2:
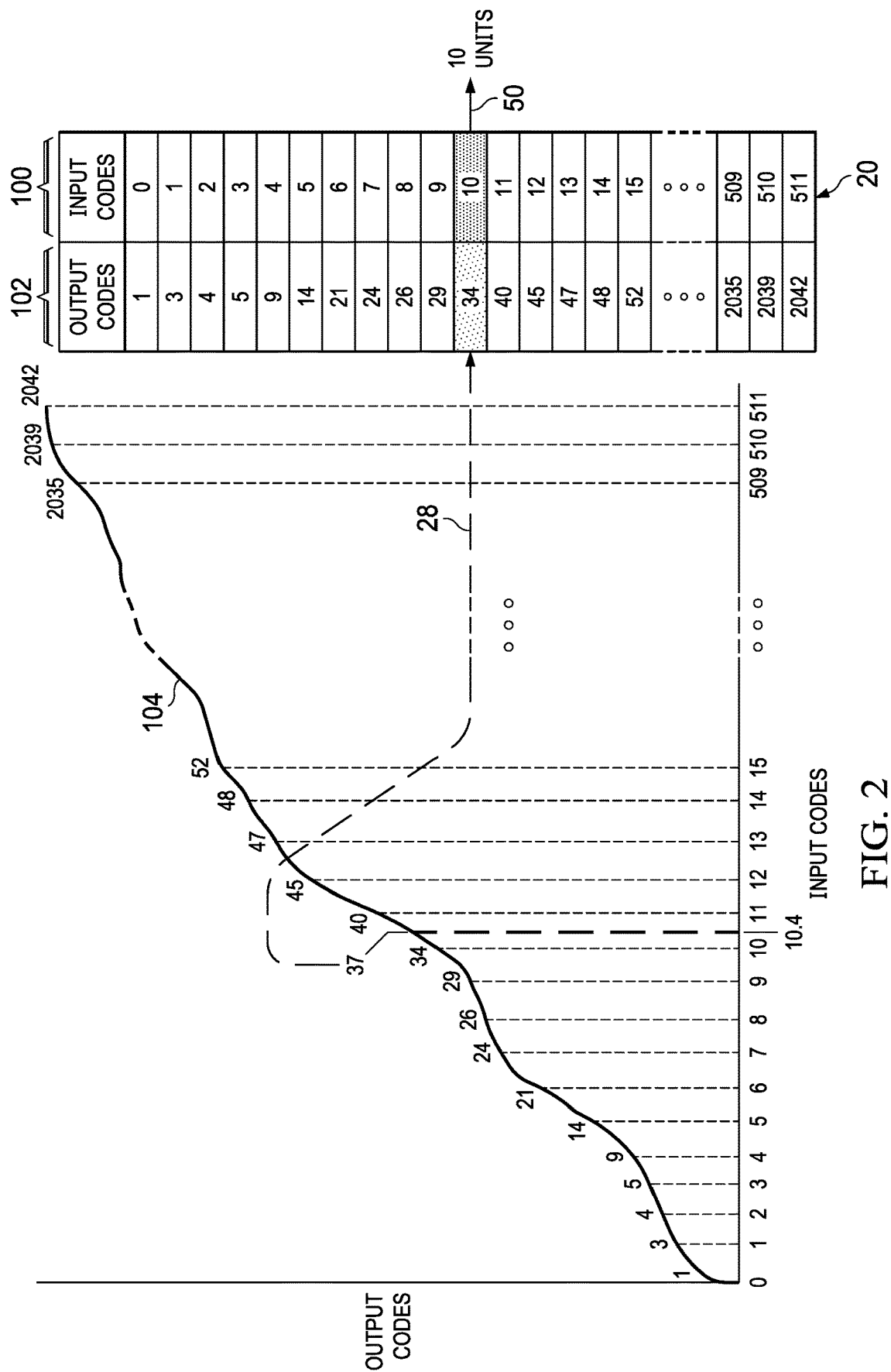
FIG. 2 is a diagram of a method of populating and using a lookup table of the analog-to-digital converter system of FIG. 1.

In the calibration mode, as illustrated by way of example in FIG. 2 (where N=9), the calibration controller 30 (FIG. 1) issues, on line 36, a series of $2^9$=512 input codes 100 (FIG. 2) to cause the digital-to-analog converter 32 (FIG. 1) to generate 512 corresponding calibration voltages $V_{DAC}$. The calibration voltages $V_{DAC}$ are transmitted to the first analog-to-digital converter 18 as output voltages $V_1$, on line 17, by the first multiplexer 12. The first analog-to-digital converter 18 converts the calibration voltages $V_{DAC}$ ($V_1$) to corresponding output codes 102 (FIG. 2) of N+n bits. To populate the lookup table, the output codes 102 are recorded in the lookup table 20 via the third multiplexer 22 (FIG. 1) and the write path 26.

In the example illustrated in FIG. 2, N+n>N (that is, n>0) to accommodate the non-linearity of the first analog-to-digital converter 18. In the illustrated example, the total number (N+n) of possible output codes 102 that may be output by the analog-to-digital converter 18 should be greater than the actual number (N) of input codes 100 stored in the lookup table 20, because, in operation, the relationship of the output codes generated by the analog-to-digital converter 18 to the corresponding input codes transmitted on line 36 is not expected to be linear. In the illustrated example, N=9, $2^9$=512, the input codes 100 stored in the lookup table 20 range from 0 to 511, and the least significant bit (LSB) of each input code 100 represents one millivolt (my) on line 17, while N+n=11, $2^{11}$=2048, and the total number of different codes 102 that may be output by the analog-to-digital converter 18 ranges from 0 to 2047.

In the lookup table 20, the $2^N$ output codes 102 that are actually generated by the analog-to-digital converter 18 in the calibration mode are correlated with the $2^N$ input codes 100 that are transmitted to the digital-to-analog converter 32 by the calibration controller 30. The empirically-developed transfer function 104 (FIG. 2) from the input codes 100 to the recorded output codes 102 is non-linear but monotonic and unique for each input code 100. In the illustrated example, the transfer function 104 is established empirically, in the calibration mode, by observing the output of the analog-to-digital converter 18 in response to different input codes 100 being input to the digital-to-analog converter 32. Moreover, the illustrated method of populating the lookup table 20 is memory-less in the sense that mapping the value of a particular input code (for example, 5) to the value of an output code (for example, 14) does not depend on the value of a previous input code (for example, 4). If desired, each capture of an output code may involve capturing multiple codes from the analog-to-digital converter 18 and averaging those codes to remove noise before mapping.

In the analog-to-digital conversion (or mission) mode, also illustrated by way of example in FIG. 2, the first multiplexer 12 (FIG. 1) receives sampled voltages $V_{IN}$ on line 16. The first multiplexer 12, under the control of the calibration controller 30, outputs the sampled voltages $V_{IN}$ ($V_1$) to the analog-to-digital controller 18 which outputs corresponding codes to the third multiplexer 22. The calibration controller 30 causes the third multiplexer 22 to apply the codes to the lookup table 20 via the read path 28.

For each unknown sampled voltage $V_{IN}$ ($V_1$), the N+n bit output of the analog-to-digital converter 18 is looked up in the lookup table 20, and its calibrated value (in N-bits of input code) is output on line 50. Based on FIG. 2, if the unknown voltage $V_{IN}$ ($V_1$) causes the analog-to-digital converter 18 to output a code for 37 units (for example), the lookup table 20 is used to output a code for 10 units on output line 50. In the illustrated example, in the mission mode, the lookup table 20 is used to select a stored input code whose corresponding stored output code is closest to the code output by the analog-to-digital converter 18, but if the code output by the analog-to-digital converter 18 is equidistant between two stored output codes, then the lookup table 20 is used to select a stored input code whose stored output code is the lower of the two stored output codes. Thus, in the example illustrated in FIG. 2, the stored input code that is selected is 34, since 37 is equidistant between 34 and 40, and 34 is less than 40.

The specific illustrated example refers to a circumstance where, when the calibration controller 30 issued an input code 100 for 10 units in the calibration mode, the digital-to-analog converter 32 applied a voltage $V_{DAC}$ ($V_1$) of 10 units, which was converted to an output code 102 for 34 units by the analog-to-digital converter 18, and that output code 100 (34 units) was recorded in the lookup table 20 correlated to the input code 102 for 10 units. In other words, when the system 10 was calibrated, a correlation between an input code of 10 units and an output code of 34 units was observed, and the observed output code (34 units) was stored in the lookup table 20 in association with the input code (10 units). The transfer function 104 is based on calibration, and the correlations stored in the lookup table 20 are made by experimentation (i.e., observation). The present disclosure should not be limited, however, to the illustrated example.

In the illustrated configuration, the digital-to-analog converter 32 is used to generate calibration voltages $V_{DAC}$ covering the input range Vr of the analog-to-digital converter 18. In the calibration mode, the linear output $V_{DAC}$ of the digital-to-analog converter 32 is input to the analog-to-digital converter 18. For each such input code 100, at stepwise intervals of $V_r/(2^N)$, output codes 102 of N+n bits are output by the analog-to-digital converter 18. The lookup table 20 may include memory elements of a digital-like circuit. In the illustrated example, the output codes 102 on lines 24 and 28 in the calibration mode are stored in the memory elements of the lookup table 20.

Thus, during the calibration mode, the non-linear input-to-output characteristics of the analog-to-digital converter 18 (a circuit block) are obtained using known input codes 100. The calibration process, during which the lookup table 20 is populated with data, may be a relatively time-consuming process which is performed at regular but long intervals. Then, during the analog-to-digital conversion mode, for an unknown sampled voltage $V_{IN}$, the system 10 digitally maps an output code 102 to the sampled voltage $V_{IN}$. The non-linear processing performed by the analog-to-digital converter 18 may occur at-speed, during which the output code of the non-linear block is passed through the invert of the block's transfer function 104 (FIG. 2) obtained in the calibration mode, to obtain a linear output (that is, the codes output on line 50). In the illustrated configuration, the calibration and analog-to-digital conversion processes advantageously may be performed without complicated mathematical functions or hardware that would have substantial space and power requirements.

If desired, the analog-to-digital converter 18 may be constructed as illustrated, by way of example, as described in connection with FIGS. 5-9. The analog-to-digital converter 18 may have delay circuits and delay comparators, operated in parallel for generating two bits of digital information. Delay residue from a multi-bit stage may be combined, by a combiner, and applied to a series of single-bit stages. If desired, the first, second, and third through i-th single-bit stages may be constructed and operated in successive stages, to provide respective bits of digital information to the lookup table 20. Although it is possible to design time-base units of the type employed in the system described below, and operate the time-based units at high speed, they are inherently non-linear. In the delay-based signal processing example described below in connection with FIGS. 5-9, the residue passed on at each stage is monotonic but non-linear.

Figure 3:
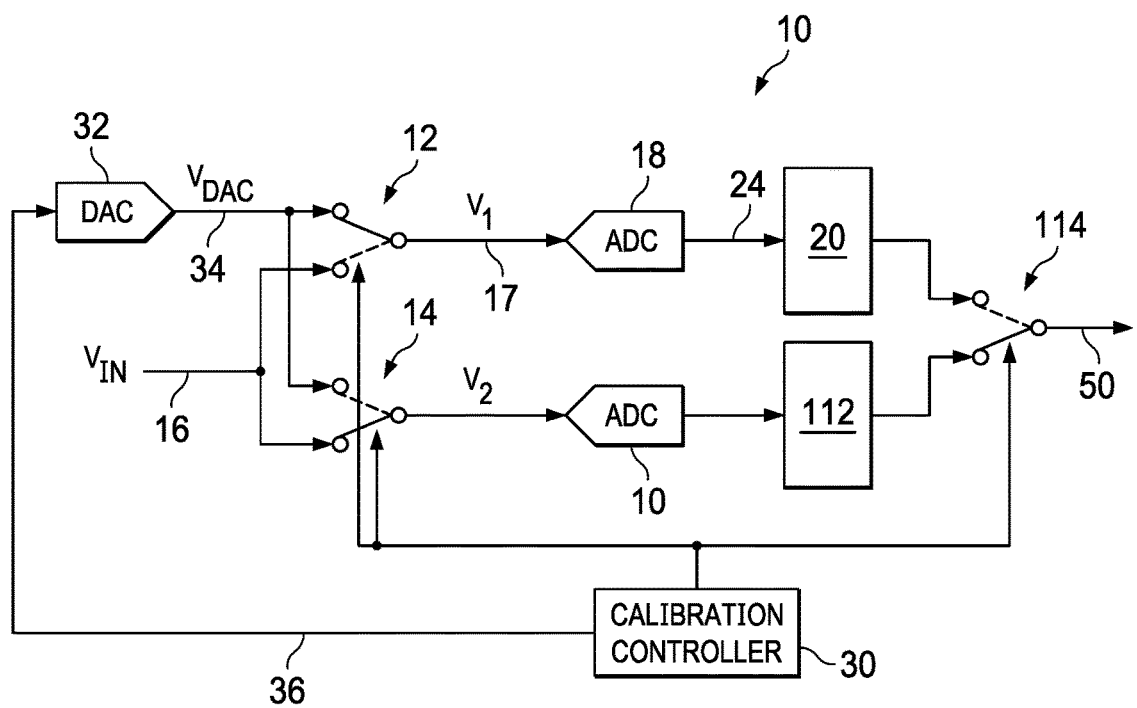
FIG. 3 is block diagram of the analog-to-digital converter system of FIG. 1, showing two analog-to-digital converters and two lookup tables arranged in parallel.

Referring now to FIGS. 3 and 4, the analog-to-digital converter system 10 may have two, three, four, five or more channels. Two channels are illustrated in FIG. 3. Three channels are illustrated in FIG. 4. As illustrated in FIG. 3, the second channel has a second analog-to-digital converter 110, a second lookup table 112, and a combiner circuit 114. The second analog-to-digital converter 110 may be essentially the same as the first analog-to-digital converter 18 in the sense that both are made of essentially the same components arranged in generally the same configuration. Nevertheless, differences in manufacturing may cause the two analog-to-digital converters 18 and 110 to have different transfer functions 104, so that it may be desirable for the two devices 18 and 110 to be separately calibrated. A fourth multiplexer like the third multiplexer 22 shown in FIG. 1 is located between the second analog-to-digital converter 110 and the second lookup table 112. The third and fourth multiplexers 22 may be constructed and operated essentially the same, and are not illustrated in FIG. 3 for the sake of clarity of illustration.

FIG. 3 shows the first channel being operated in the calibration mode while the second channel is operated in the analog-to-digital conversion mode. That is, the first multiplexer 12 is shown transmitting calibration voltages $V_{DAC}$ (through MUX 12 output, $V_1$) to the first analog-to-digital converter 18, to populate the first lookup table 20, while the second multiplexer 14 is shown transmitting sampled voltages $V_{IN}$ (through MUX 14 output, $V_2$) to the second analog-to-digital converter 110, to generate output codes which are subjected to the reverse of the transfer function recorded in the second lookup table 112 for the second analog-to-digital converter 110, to generate calibrated codes which are output on line 50 via the combiner circuit 114.

If desired, the analog-to-digital converter system 10 may be operated with the second channel in the calibration mode while the first channel is operated in the analog-to-digital conversion mode. In that case, the second multiplexer 14 transmits calibration voltages $V_{DAC}$ ($V_2$) to the second analog-to-digital converter 110 to populate the second lookup table 112, while the first multiplexer 12 transmits sampled voltages $V_{IN}$ ($V_1$) to the first analog-to-digital converter 18 to generate output codes which are subjected to the reverse of the transfer function recorded in the first lookup table 20, to generate calibrated codes which are output on line 50 via the combiner circuit 114. In the illustrated configuration, the combiner circuit 114 is selectively operated under the control of the calibration controller 30.

Referring to FIG. 4, a third channel may be provided with a third analog-to-digital converter 200 and a fifth multiplexer 202, which may be a digital multiplexer. In each of the three channels, a buffer 204, 206 and 208 is located between respective multiplexers 12, 14 and 202 and the respective analog-to-digital converters 18, 110 and 200. The buffers 204, 206 and 208 are not shown in FIGS. 1 and 3 for the sake of clarity of illustration. Likewise, suitable digital multiplexers may be located between each of the three analog-to-digital converters 18, 110 and 200 and the memory/digital processor system 300. The lookup tables 20 and 112 for the first and second channels are part of the memory/digital processor system 300, as is a similar lookup table for the third channel. Each one of the three lookup tables operates as described above in connection with the lookup table 20 of the first channel.

As illustrated in FIG. 4, a second sampled voltage $V_{IN2}$ (2) is applied to the multiplexers 14 and 202 of the second and third channels, the first sampled voltage $V_{IN}$ (1) is applied to the multiplexers 12 and 14 of the first and second channels, and the calibration voltage $V_{DAC}$ (D) is applied to multiplexers 12, 14 and 202 of all three of the channels. If desired, the analog-to-digital converter system 10 may be configured to receive and process third and fourth sampled voltages (0) and (3) applied to the first and fourth multiplexers 12 and 202, respectively. The three channels, and the digital-to-analog converter 32, are all operated under the control of the calibration controller 30 which is not shown in FIG. 4 for the sake of clarity.

Thus, if desired, one of the channels of the analog-to-digital converter system 10 may be calibrated while one or more of the other channels are used for analog-to-digital conversion. The multi-channel configuration has the advantage of relatively easy scalability. In the illustrated configuration, all of the channels may be calibrated using only a single digital-to-analog converter 32, and the number of channels per system can be increased without a proportionate increase in high-linearity block, and thus power and area may be conserved. Moreover, there does not need to be any matching requirements between different channels. In the illustrated configuration, each analog-to-digital converter 18, 100 and 200 may be calibrated independently which reduces or eliminates requirements for background estimation and calibration algorithms.

According to another aspect of the present disclosure, in a case where a non-linear analog-to-digital converter cannot be taken out of mission mode, an auxiliary analog-to-digital converter of the same type may be used in a round-robin fashion, where the first analog-to-digital converter is in a calibration phase while the other analog-to-digital converter serves the mission mode, and vice versa. In this aspect of the present disclosure, input and digital-to-analog converter outputs are multiplexed to the first and auxiliary analog-to-digital converters.

If desired, some or all of the elements of the devices and systems described herein may be integrated into an integrated circuit (IC) and/or formed on or over a single semiconductor die (not shown in the drawings) according to various semiconductor and/or other processes. The conductive lines may be metal structures formed in insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates, and other suitable electronic devices that are not shown in the drawings for the sake of clarity.

The analog-to-digital system 10 may have a satisfactory signal-to-noise ratio (SNR), operate at high speed, and work with lower tech nodes. According to one aspect of the present disclosure, advantages are achieved by providing a linear analog-to-digital converter system which has highly non-linear delay-based components (for example, of the type illustrated in FIG. 5) but which operates at high speed, with relaxed area and power requirements, and which scales well with tech nodes. In summary, the present disclosure may be used to provide a highly linear high-speed analog-to-digital converter system 10 using inherently non-linear analog blocks operatively connected to digital circuits.

In terms of scalability, it should be noted that the performance of digital integrated circuits has improved massively with CMOS scaling but this has not been applicable to analog integrated circuits. According to the present disclosure, CMOS scaling can be used to improve performance in an analog integrated circuit by using time domain (or delay domain) signal processing. An analog-to-digital converter system which uses a time-to-digital converter (TDC) is therefore advantageous. The time-to-digital converter may be inherently non-linear but can be designed to be memoryless and monotonic, and may be very fast and have very good bit error rate (BER) performance as no critical feedback loop may be required. These advantageous characteristics may be achieved, if desired, by constructing the back end of the analog-to-digital converter 18 as illustrated in FIGS. 5-9, with memory-less devices. As indicated above, according to one aspect of the present disclosure, mapping the value of a particular input code (for example, 5) to the value of an output code (for example, 14) does not depend on the value of a previous input code (for example, 4). Moreover, the back end of the analog-to-digital converter 18 may be constructed such that whenever, during calibration, the input code (on line 36) increases, the corresponding output code (on line 24) also increases, though not necessarily in a linear manner.

The present disclosure provides many advantages. One such advantage is the ability to decouple what would otherwise be coupled constraints. In particular, an effectively fast and linear analog-to-digital converter system may be constructed by combining at least three components, as follows: (1) a linear, low-speed digital-to-analog converter 32; (2) one or more non-linear digital-to-analog converters 18, 110 and 200 formed of high-speed analog blocks; and (3) a memory/digital processing system 300 which has one or more high speed digital-like lookup tables 20 and 112.

Using the architecture described herein, a high linearity requirement may be passed on to the digital-to-analog converter 32 instead of the analog-to-digital converters 18, 110 and 200. This is an advantage because it is relatively less difficult to design and implement analog circuits for operation at lower speed with linearity and accuracy. According to the present disclosure, one or more analog-to-digital converters 18, 110 and 200 may be designed to run at high speed by compromising on linearity. However, coupled with the lookup tables 20 and 112, the analog-to-digital converters 18, 110 and 200 can behave like linear analog-to-digital converters. Likewise, the memories 20 and 122 may be implemented in digital circuits, and be configured for high speed.

Interfacing external analog signals to fast digital processing cores generally requires an analog-to-digital converter. With higher speeds in transmission of data, the analog-to-digital converter may be required to operate at very high speeds and with a good signal-to-noise ratio. Without the benefits of the present disclosure, such constraints could result in large power dissipation and large area requirements for the supporting integrated circuit. These issues may be especially prominent at Ghz rates because of analog non-idealities which may limit performance. The present disclosure provides a lookup-table-based analog-to-digital converter approach that can open up wide architectures using one or more analog-to-digital converters that may be inherently non-linear but can be calibrated to provide the superior performance of a highly linear analog-to-digital converter.

The analog-to-digital converter 18 illustrated in FIG. 1 may have a front end and a back end. The front end may perform a voltage-to-delay function. The back end may perform a delay-to-digital function. According to one aspect of the present disclosure, the front end of the analog-to-digital converter 18 may include one or more voltage-to-delay devices for converting the analog signal on line 17 into delay signals $A_0$ and $B_0$ on lines 488 and 490 (FIG. 5), such that the timings of the delay signals $A_0$ and $B_0$ are representative of the voltage $V_1$ on line 17. The voltage-to-delay devices of the front end, which may be used to generate the delay signals $A_0$ and $B_0$ based on the input voltage $V_1$, may be constructed and operated, for example, as described in U.S. Pat. No. 10,673,456 (based on U.S. patent application Ser. No. 16/410,698). The voltage-to-delay devices may include, for example, a conversion and folding circuit described in U.S. Pat. No. 10,673,456, which includes a voltage-to-delay converter block, including preamplifiers, for converting a voltage signal into delay signals, and a folding block, including logic gates coupled to the preamplifiers, for selecting earlier-arriving and later-arriving ones of the delay signals.

Examples of voltage-to-delay devices which may employed within the front end of the analog-to-digital converter 18, and used to generate the delay signals $A_0$ and $B_0$ based on the input voltage $V_1$, are illustrated in U.S. patent application Ser. No. 17/131,981, filed Dec. 23, 2020. A voltage-to-delay device constructed in accordance with U.S. patent application Ser. No. 17/131,981 may have, for example, first and second comparators connected to first and second lines carrying complementary voltages representative of the input voltage $V_1$, for generating first and second output signals during an active phase when the complementary voltages reach a suitable threshold voltage, such that delay between the output signals is representative of the input voltage $V_1$. The present disclosure is not limited, however, to the devices and processes described in detail herein. Other suitable devices may perform a suitable voltage-to-delay function within the front end of the analog-to-digital converter 18. As noted above, the entire disclosures of U.S. Pat. No. 10,673,456 and U.S. patent application Ser. No. 17/131,981 are incorporated herein by reference.

Figure 5:
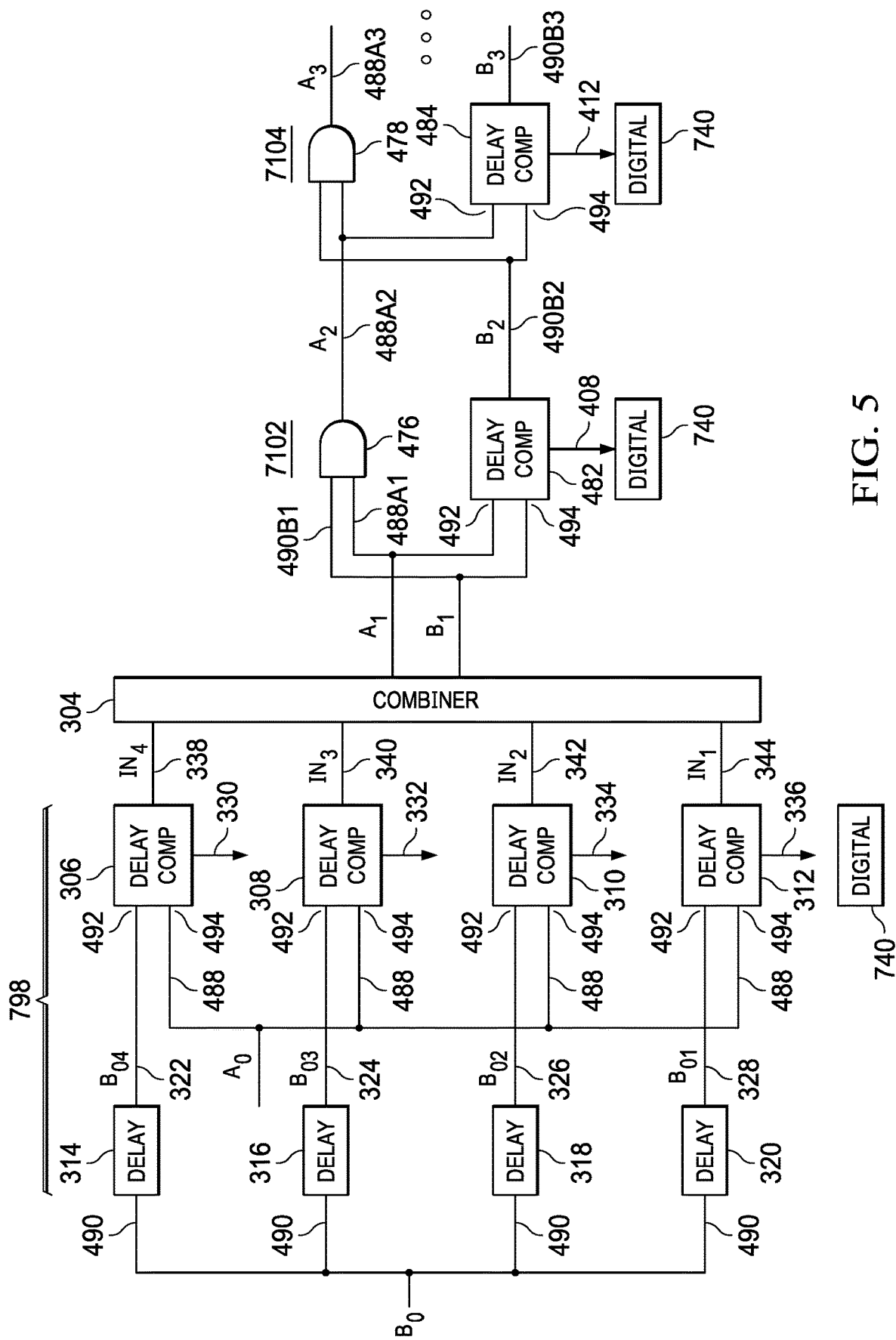
FIG. 5. is a block diagram of a back end of the analog-to-digital converter of FIG. 1.

An example embodiment of the back end of the analog-to-digital converter is illustrated by way of example in FIGS. 5-9. The back end may have, for example, a multi-bit stage 798, and first through i-th single-bit stages 7102 and 7104 connected in series to the multi-bit stage 798. If desired, the back end may have three, four or more than four such single-bit stages (i=3, 4 or more). The single-bit stages 7102 and 7104 illustrated in FIG. 5 are examples of successive non-linear stages. The back end receives the delay signals $A_0$ and $B_0$ from a voltage-to-delay circuit of the front end. The timings of the delay signals $A_0$ and $B_0$ have a delay which is representative of the voltage $V_1$ on line 17. The back end works with a calibration engine/controller 740 to generate a corresponding multi-bit digital code which is output on line 24 (FIG. 1). Thus, the digital code on line 24 predictably corresponds to a value which closely approximates the voltage $V_1$ on line 17.

The multi-bit stage 798 (FIG. 5) may have delay circuits and delay comparators, operated in parallel, for generating M bits of digital information, on lines 330, 332, 334 and 336. In the illustrated example, M=2. However, M may be greater than 2. This disclosure is not limited to the illustrated example. Delay residue from the multi-bit stage 798 may be combined by a combiner 304 and applied to the first single-bit stage 7102. If desired, the first through i-th single-bit stages 7102 and 7104 may be constructed and operated as successive stages, to provide respective bits of digital information to the calibration engine/controller 740.

The first stage 798 may have, for example, four delay comparators 306, 308, 310 and 312, and is connected to the combiner 304. This disclosure is not limited, however, to the details of the illustrated example. This disclosure may be implemented, if desired, with a first stage which has fewer or more than four delay comparators. In the configuration shown in the drawings, the first stage 798 generates two bits of digital information for the calibration engine/controller 740. In the illustrated embodiment, each one of the successive stages 7102 and 7104 generates a single bit of digital information for the calibration engine/controller 740.

In the illustrated example, the leading edge of the signal $B_0$ on line 490 precedes the leading edge of the signal $A_0$ on line 488. The first signal $A_0$ is applied to threshold inputs 494 of the delay comparators 306, 308, 310 and 312. In the illustrated configuration, by way of example, the delay comparators 306, 308, 310 and 312 are essentially identical to each other. The second signal $B_0$ is applied to four different delay circuits 314, 316, 318 and 320 which generate four corresponding signals $B_{04}$, $B_{03}$, $B_{02}$ and $B_{01}$ on respective lines 322, 324, 326 and 328.

The timings of the corresponding signals $B_{04}$, $B_{03}$, $B_{02}$ and $B_{01}$ are delayed relative to the timing of the signal $B_0$ on line 490 by different, known amounts each of which is less than or equal to the maximum gain of the front end. The delayed signals $B_{04}$, $B_{03}$, $B_{02}$ and $B_{01}$ are applied to first inputs 492 of the respective delay comparators 306, 308, 310 and 312. The first delay comparator 306 issues a sign signal on line 330 representative of which signal ($B_{04}$ or $A_0$) arrives at the first delay comparator 306 first. Likewise, the second delay comparator 308 issues a sign signal on line 332 representative of which signal ($B_{03}$ or $A_0$) arrives at the second delay comparator 308 first. Likewise, the third and fourth delay comparators 310 and 312 issue sign signals on lines 334 and 336 representative of which signals arrive at the third and fourth delay comparators 310 and 312 first.

Since the delay circuits 314, 316, 318 and 320 are different from each other, the timings of the leading edges of the delayed signals $B_{04}$, $B_{03}$, $B_{02}$ and $B_{01}$ are different from each other. Each one of the delay comparators 306, 308, 310 and 312 issues a sign signal, on respective digital lines 330, 332, 334 and 336, to the calibration engine/controller 740. The sign signals on lines 330, 332, 334 and 336 are functionally related to the difference in timing between the leading edges of the input signals $A_0$ and $B_0$ and are therefore functionally related to voltage $V_1$ on line 17.

Since the amounts of delay provided by the four delay comparators 306, 308, 310 and 312 are different from each other, the sign signals 330, 332, 334 and 336 provide four binary data points for determining two bits of the output. For example, if $B_0$ precedes $A_0$, and $B_{01}$ precedes $A_0$, then the calibration engine/controller 740 determines that the delay between the timings of signals $A_0$ and $B_0$ is greater than the delay contributed by the fourth delay circuit 320. Likewise, if $B_0$ precedes $A_0$, and $A_0$ precedes $B_{02}$, $B_{03}$ and $B_{04}$ then the calibration engine/controller 740 determines that the delay between the timings of signals $A_0$ and $B_0$ is less than each of the delays contributed by the third, second and first delay circuits 318, 316 and 314.

If desired, the structure and operation of the delay comparators 306, 308, 310 and 312 may be the same as those of a delay comparator 482 described below. In operation, the delay comparators 306, 308, 310 and 312 generate respective delay signals $IN_4$, $IN_3$, $IN_2$ and $IN_1$ on respective output lines 338, 340, 342 and 344. The delay signals $IN_4$, $IN_3$, $IN_2$ and $IN_1$ are applied to the combiner 304 by the output lines 338, 340, 342 and 344. In the illustrated configuration, the delay circuits 314, 316, 318 and 320 are different from each other and contribute different amounts of delay, while the delay comparators 306, 308, 310 and 312 are essentially the same. Therefore, the timings of the leading edges of the delay signals $IN_4$, $IN_3$, $IN_2$ and $IN_1$ are different from each other.

Figure 6:
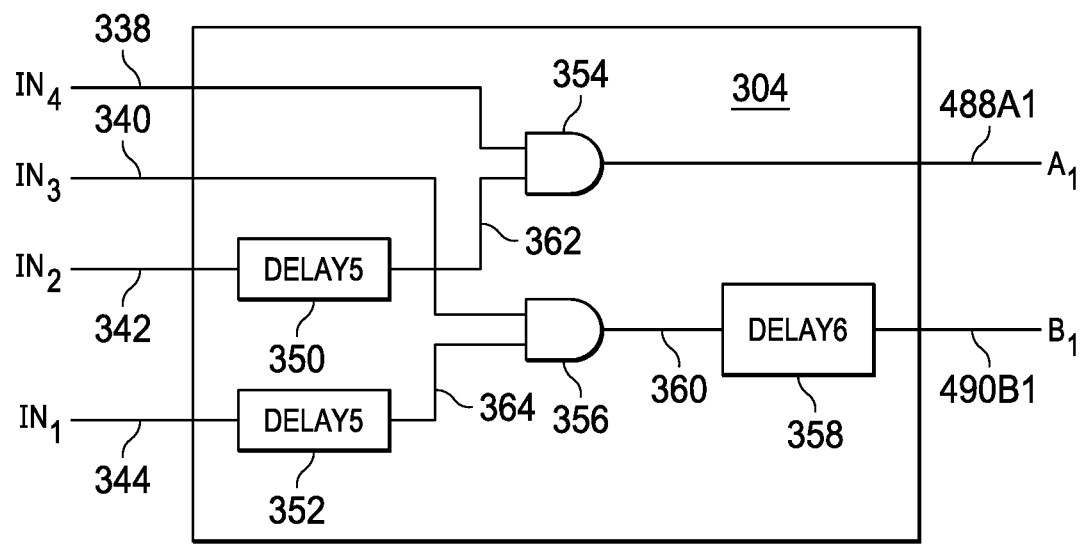
FIG. 6 is a block diagram of a combiner for connecting a multi-bit stage shown in FIG. 5 to a first one of single-bit stages.

In the example illustrated in FIG. 6, the combiner 304 has two fifth delay circuits 350 and 352, two AND gates 354 and 356, and a sixth delay circuit 358. In the illustrated configuration, the fifth delay circuits 350 and 352 are essentially identical to each other. However, this disclosure is not limited to the details of the configurations shown and described herein. The third and fourth delay signals $IN_2$ and $IN_1$ are applied to the fifth delay circuits 350 and 352, on conductive lines 342 and 344, and the first and second delay signals $IN_4$ and $IN_3$ are applied to the AND gates 354 and 356, on conductive lines 338 and 340. Output signals from the fifth delay circuits 350 and 352 are also applied to the AND gates 354 and 356, on conductive lines 362 and 364, respectively. An output signal from one of the AND gates 356 is applied to the sixth delay circuit 358, on a conductive line 360, and the other AND gate 354 generates a signal $A_1$ on conductive line 488A1. The sixth delay circuit 358 generates a signal $B_1$ on conductive line 490B1.

In operation, the timings of the leading edges of the signals output from the fifth and sixth delay circuits 350, 352 and 358 on conductive lines 362, 364 and 490, are delayed relative to the respective timings of the leading edges of the signals input to the delay circuits 350, 352 and 358. The timings of the leading edges of signals output from the AND gates 354 and 356, on lines 488A1 and 360, correspond to the respective timings of the later-arriving of the signals input to the AND gates 354 and 356. The relative timing of the leading edges of the signals $A_1$ and $B_1$ on lines 488A1 and 490B1 is functionally (that is, predictably) related to the voltage $V_1$ on line 17 (FIG. 1). In other words, the delay circuits 350, 352 and 358 and the logic gates 354 and 356 establish a transfer function between the delay of the incoming signals $IN_4$, $IN_3$, $IN_2$ and $IN_1$ and the delay of the first and second signals $A_1$ and $B_1$.

For the illustrated configuration, the transfer function is as follows: [A] if the timing of the signal on line 338 precedes the timing of the signal on line 362 (where the timing of the signal on line 362 corresponds to the timing of the signal on line 342 delayed by the fifth delay circuit 350), then the timing of the signal on line 488A1 corresponds to the timing of the signal on line 362, but if the timing of the signal on line 362 precedes the timing of the signal on line 338, then the timing of the signal on line 488A1 corresponds to the timing of the signal on line 338; [B] if the timing of the signal on line 340 precedes the timing of the signal on line 364 (where the timing of the signal on line 364 corresponds to the timing of the signal on line 344 delayed by the fifth delay circuit 352), then the timing of the signal on line 360 corresponds to the timing of the signal on line 364, but if the timing of the signal on line 364 precedes the timing of the signal on line 340, then the timing of the signal on line 360 corresponds to the timing of the signal on line 340; and [C] the timing of the signal on line 490B1 corresponds to the timing of the signal on line 360 delayed by the sixth delay circuit 358.

The amounts by which the delay elements 350, 352 and 358 delay the signals transmitted through them may be selected to maximize or improve the gain of the first and second signals $A_1$ and $B_1$ to the extent practicable. The combiner 304 operates in delay mode, where gain relates to delay (not voltage). If the gain of the first and second signals $A_1$ and $B_1$ is too low, meaning that the timings of the first and second signals $A_1$ and $B_1$ are too close to each other, then the information represented by the relative timing of those signals may be difficult to resolve.

One aspect of the present disclosure is that the timings of the signals on lines 488A1 and 490B1 are functionally (that is, predictably) related to the timings of the signals on lines 338, 340, 342 and 344. If a certain set of signal timings on lines 338, 340, 342 and 344 results in a first set of signal timings on lines 488A1 and 490B1, the same first set of signal timings on lines 488A1 and 490B1 may be expected to occur whenever the same set of signal timings occurs on lines 338, 340, 342 and 344. Likewise, if another set of signal timings on lines 338, 340, 342 and 344 results in a second set of signal timings on lines 488A1 and 490B1, the same second set of signal timings on lines 488A1 and 490B1 may be expected to occur whenever the other set of signal timings occurs on lines 338, 340, 342 and 344. And since the timings of the signals on lines 338, 340, 342 and 344 are functionally (that is, predictably) related to the voltage $V_1$, the timings of the signals on lines 488A1 and 490B1 are also functionally related to the voltage $V_1$.

Referring again to FIG. 5, the signals $A_1$ and $B_1$ generated by the combiner 304 are applied to the second stage 7102 on the output lines 488A1 and 490B1. The second stage (which is a first residual stage) 7102 is coupled to the first stage 798 (through the combiner 304), and the i-th stage 7104 (which is a second residual stage in the illustrated example) is coupled to the second stage 7102.

In the illustrated example, the second through i-th stages 7102 and 7104 each include AND gates (such as AND gate 476 for stage 7102 and AND gate 478 for stage 7104) and delay comparators (such as delay comparator 482 for stage 7102 and delay comparator 484 for stage 7104). The illustrated AND gates are merely examples, however, of logic gates that may be employed according to this disclosure. If desired, this disclosure may be implemented with or without AND gates and/or with or without gates other than AND gates.

Further, in the illustrated configuration, the AND gates 476 and 478 may be essentially identical to each other, and the delay comparators 482 and 484 may be essentially identical to each other. The conductive output lines 488A1 and 490B1 from the combiner 304 are coupled to inputs of the first AND gate 476 and delay comparator 482. Specifically, the conductive line 488A1 is coupled to a first input 492 of the delay comparator 482, and the conductive line 490B1 is coupled to a threshold input 494 of the delay comparator 482.

An output line 488A2 from the AND gate 476 is electrically coupled to one of the inputs of the AND gate 478, and to the input 492 of the delay comparator 484. A conductive line 490B2 from the first delay comparator 482 is electrically coupled to the other one of the inputs of the AND gate 478, and to the threshold input 494 of the delay comparator 484. The pattern created by the second and third stages 7102 and 7104 may be continued for as many additional stages as desired. Each successive stage has an AND gate and a delay comparator essentially identical to the AND gates and the delay comparators of the second and third stages 7102 and 7104, and is electrically coupled to the AND gate and delay comparator of a preceding stage in the same way.

Figure 7:
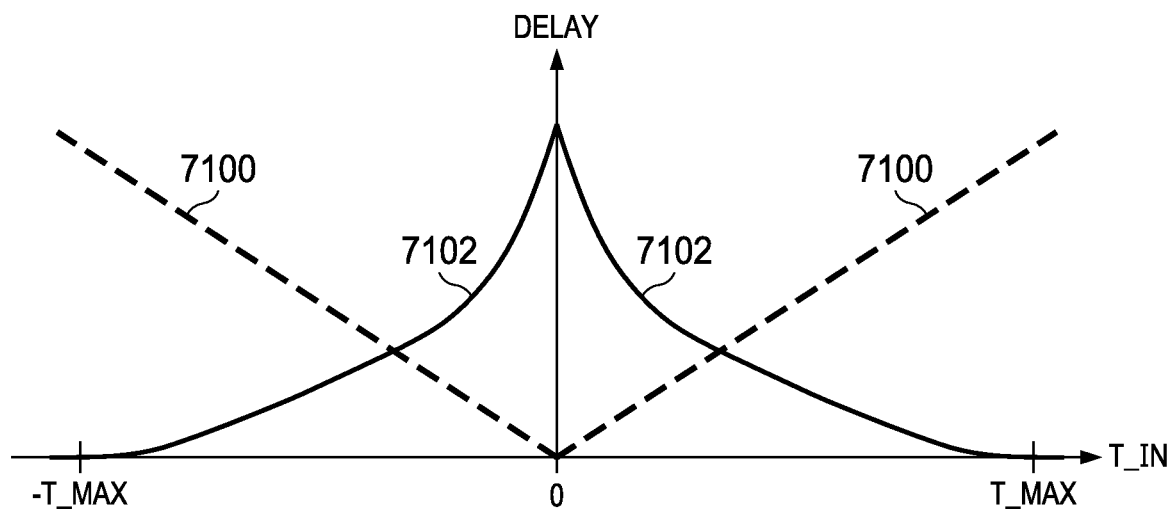
FIG. 7 is a graph which illustrates AND-gate delay and comparator delay generated by an AND gate and a delay comparator, respectively, of the back end of FIG. 5, where the AND-gate delay and the comparator delay are functions of input-signal delay.
Figure 8:
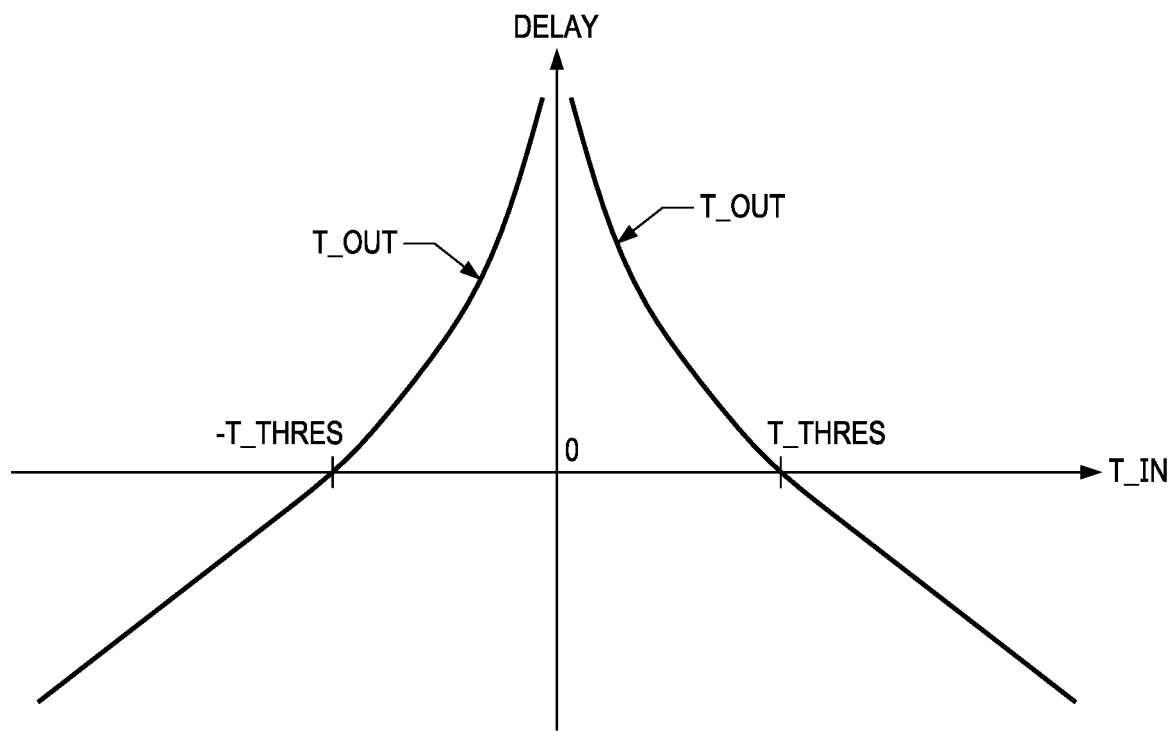
FIG. 8 is a graph which illustrates output-signal delay as a function of the input-signal delay of FIG. 7.

In operation, signals $A_N$ and $B_N$ (where N=1, 2, 3 . . . for stages 7102 and 7104 . . . respectively) are applied to respective ones of the AND gates 476 and 478, causing the AND gates 476 and 478 to generate corresponding signals $A_N+1$. For each one of the AND gates 476 and 478, the timing of the leading edge of signal $A_N+1$ tracks the timing of the leading edge of the later-arriving of signals $A_N$ and $B_N$. In particular, for each one of the AND gates 476 and 478, the timing of the leading edge of signal $A_N+1$ is equal to the timing of the leading edge of the earlier-arriving of signals $A_N$ and $B_N$ plus an amount of time that is related to the extent to which the leading edge of the later-arriving of signals $A_N$ and $B_N$ lags behind the leading edge of the earlier-arriving of signals $A_N$ and $B_N$. As illustrated in FIG. 7, the AND-gate delay 7100 contributed by a respective AND gate is linearly related to the absolute value of an input-signal delay T_IN, where the input-signal delay T_IN is the difference in timing between signals $A_N$ and $B_N$ input into the respective AND gate. In the illustrated configuration, the relationship of the AND gate delay 7100 to the input-signal delay T_IN is linear regardless of whether $A_N$ or $B_N$ leads or follows.

Signals $A_N$ and $B_N$ are also applied to the inputs 492 and threshold inputs 494, respectively, of the delay comparators 482 and 484, causing the delay comparators 482 and 484 to generate corresponding signals $B_N+1$. For each one of the delay comparators 482 and 484, the timing of the leading edge of signal $B_N+1$ tracks the timing of the leading edge of the earlier-arriving of signals $A_N$ and $B_N$. In particular, for each one of the delay comparators 482 and 484, the timing of the leading edge of signal $B_N+1$ is equal to (1) the timing of the leading edge of the earlier-arriving of signals $A_N$ and $B_N$ plus (2) a comparator delay 7102 (FIG. 7) that is logarithmically inversely related to the absolute value of the input-signal delay T_IN (in other words, comparator delay is greater for input values that are more similar—if the difference between the two inputs to the comparator is greater, the comparator delay is less).

Subtracting the AND gate-delay 7100 from the comparator delay 7102 yields the output-signal delay T_OUT (FIG. 8) for any given single-bit stage 7102 and 7104. When the absolute value of the input-signal delay T_IN is less than a threshold delay T_THRES, then the output-signal delay T_OUT is a positive value (meaning that the leading edge of signal $B_N+1$ generated by the respective delay comparator 482 and 484 precedes the leading edge of signal $A_N+1$ generated by the respective AND gate 476 and 478). On the other hand, when the absolute value of the input-signal delay T_IN is greater than the threshold delay T_THRES, then the output-signal delay T_OUT is a negative value (meaning that the leading edge of signal $B_N+1$ lags behind the leading edge of corresponding signal $A_N+1$). The positive or negative character of the output-signal delay T_OUT is reported to the calibration engine/controller 740 on the signal line of the successive delay comparator.

In operation, the first delay comparator 482 issues a first sign signal ("1" or "0") on digital line 408 (an example of a digital output) to the calibration engine/controller 740. The first sign signal (an example of a digital signal in accordance with this disclosure) is based on which one of the leading edges of signals $A_1$ and $B_1$ is first received by the first delay comparator 482, such that the first sign signal reflects the order of the leading edges of signals $A_1$ and $B_1$ applied to the first input 492 and threshold input 494 of the delay comparator 482. The AND gate 476 and the delay comparator 482 generate signals $A_2$ and $B_2$ which are applied to the AND gate 478 and the delay comparator 484 of the third stage 104. The delay comparator 484 outputs a second sign signal ("1" or "0") on a second digital line 412 to the calibration engine/controller 40. The second sign signal is based on which one of the leading edges of the signals $A_2$ and $B_2$ is first received by the second delay comparator 484, such that the second sign signal reflects the order of the leading edges of the signals $A_2$ and $B_2$ applied to the inputs 492 and 494 of the second delay comparator 484.

Since the delay between signals $A_1$ and $B_1$ can be predicted as a function of the input voltage $V_1$, and vice versa, and since the delay between the signals $A_{N+1}$ and $B_{N+1}$ output by a successive stage can be predicted as a function of the signals $A_N$ and $B_N$ received from the preceding stage, and vice versa, the sign signals output by the delay comparators of the cascade of stages can be predicted as a function of the voltage $V_1$, and vice versa. Therefore, a code made up of the sign signals may be reliably compared to a predetermined correlation to determine an approximation of the input voltage $V_1$. In operation, the timings of the signals on lines 488A1 and 490B1 are functionally (that is, predictably) related to the timings of the signals on lines 488 and 490, as discussed above. The timings of the signals on lines 488A2 and 490B2 are functionally (that is, predictably) related to the timings of the signals on lines 488A1 and 490B1. The timings of the signals on lines 488A3 and 490B3 are functionally (that is, predictably) related to the timings of the signals on lines 488A2 and 490B2, and so on.

Moreover, where a certain set of signal timings on lines 488 and 490 results in a first set of signal timings on lines 488A1, 490B1, 488A2, 490B2, 488A3, 490B3, and so on, the same first set of signal timings on lines 488A1, 490B1, 488A2, 490B2, 488A3, 490B3, and so on may be expected to occur whenever the same set of signal timings occurs on lines 488 and 490. Likewise, if another, different set of signal timings on lines 488 and 490 results in a second set of signal timings on lines 488A1, 490B1, 488A2, 490B2, 488A3, 490B3, and so on, the same second set of signal timings on lines 488A1, 490B1, 488A2, 490B2, 488A3, 490B3, and so on may be expected to occur whenever the other set of signal timings occurs on lines 488 and 490. And since the timings of the signals on lines 488 and 490 are functionally (that is, predictably) related to the input voltage $V_1$, the timings of the signals on lines 488A1, 490B1, 488A2, 490B2, 488A3, 490B3, and so on, which determine the sign signals used to make up the output code, are also functionally related to the input voltage $V_1$.

Figure 9:
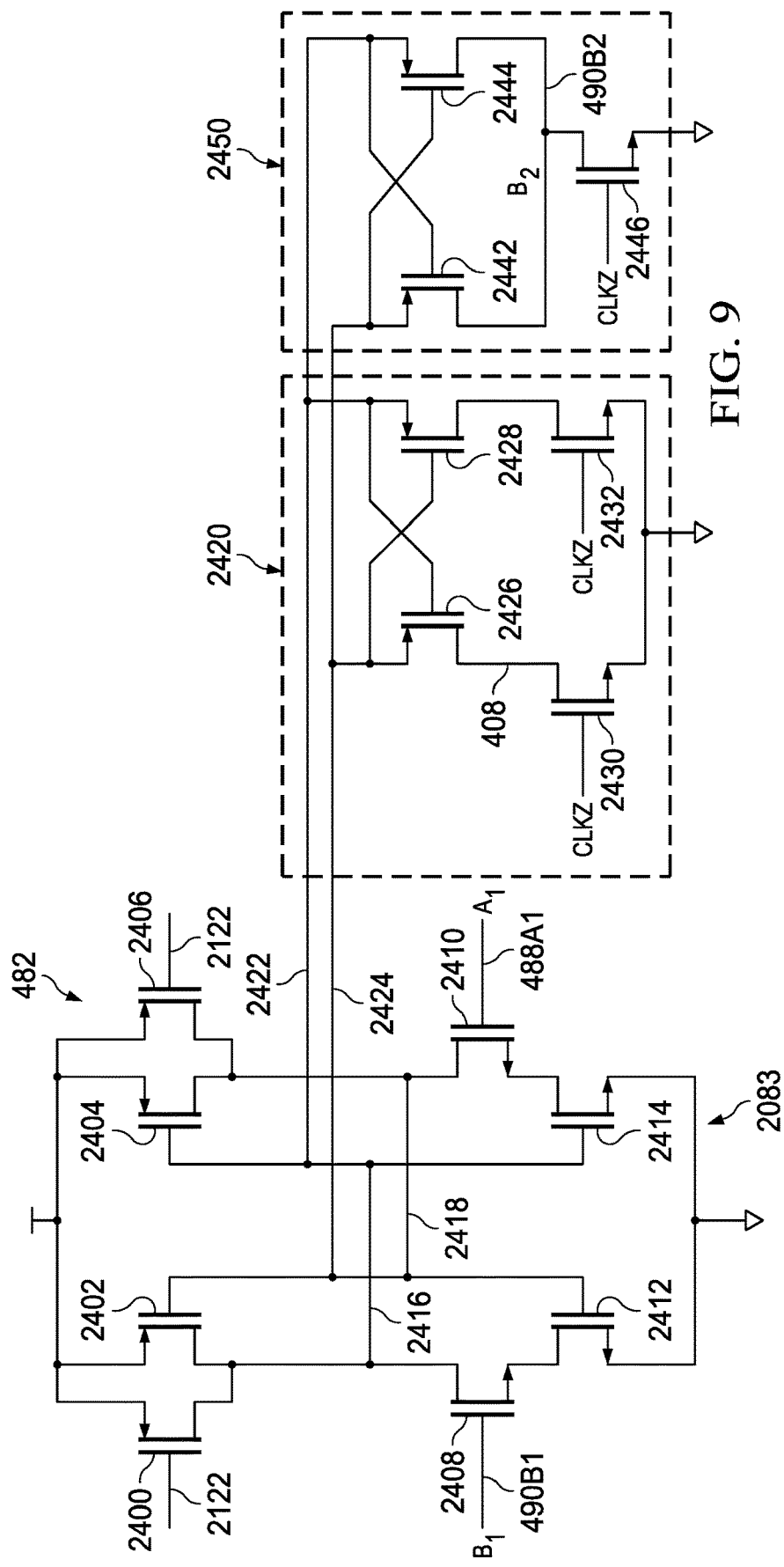
FIG. 9 is a circuit diagram of an example of a comparator circuit merged with sign-out and delay-out circuits for the back end of FIG. 5.

Referring now to FIG. 9, the delay comparator 482 has a comparator circuit 2083 which has first, second, third, fourth, fifth, sixth, seventh, and eighth transistors 2400, 2402, 2404, 2406, 2408, 2410, 2412 and 2414. In the illustrated example, the timing of the delay comparator 482 is controlled by a signal from a clock (CLK) applied to the gates of the first and fourth transistors 2400, 2406, on a conductive line 2122. The first and second signals $A_1$, $B_1$ on lines 488A1 and 490B1 are applied to the gates of the sixth and fifth transistors 2410 and 2408, respectively. The drains of the first, second, and fifth transistors 2400, 2402 and 2408 are electrically connected to each other, and to the gates of the third and eighth transistors 2404 and 2414, via a first conductive line 2416. The drains of the third, fourth, and sixth transistors 2404, 2406 and 2410 are likewise electrically connected to each other, and to the gates of the second and seventh transistors 2402 and 2412, via a second conductive line 2418.

The first and second conductive lines 2416 and 2418 of the comparator circuit 2083 are electrically connected to a sign-out circuit 2420 via respective third and fourth conductive lines 2422 and 2424. As illustrated in FIG. 9, the sign-out circuit 2420 is merged with the comparator circuit 2083. The sign-out circuit 2420 has first, second, third and fourth transistors 2426, 2428, 2430 and 2432. The third conductive line 2422 is electrically connected to the gate and the source of the first and second transistors 2426 and 2428 of the sign-out circuit 2420, respectively, while the fourth conductive line 2424 is electrically connected to the source and the gate of the first and second transistors 2426 and 2428 of the sign-out circuit 2420, respectively.

In operation, when the delay comparator 482 is enabled by the clock signal on line 2122, a sign signal is generated within the sign-out circuit 2420 on line 408. The sign signal is forwarded to the calibration engine/processor 40 on line 408, and represents the order in which the output signals $A_1$ and $B_1$ arrive at the first and threshold inputs 492 and 494 of the delay comparator 482. The operation of the sign-out circuit 2420 is controlled by an inverted clock signal CLKZ applied to the gates of the third and fourth transistors 2430 and 2432 of the sign-out circuit 2420. The inverted clock signal CLKZ is an inverted version of the clock signal that is applied to the gates of the first and fourth transistors 2400 and 2406 of the comparator circuit 2083 on line 2122.

The third and fourth conductive lines 2422 and 2444 are also electrically connected to a delay-out circuit 2450. As illustrated in FIG. 9, the delay-out circuit 2450 is merged with the comparator circuit 2083. The delay-out circuit 2450 has first, second and third transistors 2442, 2444 and 2446. The third conductive line 2422 is electrically connected to the gate and the source of the first and second transistors 2442 and 2444 of the delay-out circuit 2450, respectively, while the fourth conductive line 2424 is electrically connected to the source and the gate of the first and second transistors 2442 and 2444 of the delay-out circuit 2450, respectively.

In operation, a delay signal $B_2$ is generated on line 490B2 which is electrically connected to the drains of both of the first and second transistors 2442 and 2444 of the delay-out circuit 2450. The timing of the leading edge of the delay signal $B_2$ on line 490B2 relative to the timing of the earlier-arriving of the leading edges of the signals $A_1$ and $B_2$ on inputs 492 and 494 is the comparator delay 7102 (FIG. 7). The operation of the delay-out circuit 2450 (FIG. 9) is controlled by the same inverted clock signal CLKZ that is applied to the third and fourth transistors 2430, 2432 of the sign-out circuit 2420. The inverted clock signal CLKZ is applied to the gate of the third transistor 2446 of the delay-out circuit 2450. The drain of the third transistor 2446 of the delay-out circuit 2450 is electrically connected to the drains of the first and second transistors 2442, 2444 of the delay-out circuit 2450.

What have been described above are examples. This disclosure is intended to embrace alterations, modifications, and variations to the subject matter described herein that fall within the scope of this application, including the appended claims. If desired, for example, one or more clockless delay comparators may be employed in the back end of the analog-to-digital converter 18.

As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. An analog-to-digital converter system, comprising:
    calibration circuitry having a digital code input and a calibration voltage output, the calibration voltage output is based on the digital code input; and
    a first analog-to-digital converter (ADC) having an input operable to be connected to the calibration voltage output or a sampled voltage, the first analog-to-digital converter operable to output first digital output codes based on the calibration voltage output and second digital output codes based on the sampled voltage and the first digital output codes.

2. The analog-to-digital converter system of claim 1, wherein the calibration circuitry includes a digital-to-analog converter, and wherein the analog-to-digital converter system further includes a first multiplexer, connected to the digital-to-analog converter and the analog-to-digital converter, for selectively transmitting the calibration voltage output and sampled voltage to the analog-to-digital converter.

3. The analog-to-digital converter system of claim 2, further comprising a calibration controller, connected to the digital-to-analog converter and the first multiplexer, for transmitting the digital code input to the digital-to-analog converter, and for causing the multiplexer to transmit the calibration voltage output to the analog-to-digital converter while the digital code input is transmitted to the digital-to-analog converter.

4. The analog-to-digital converter system of claim 3, further comprising a second analog-to-digital converter, connected to the digital-to-analog converter, for receiving the calibration voltage output from the digital-to-analog converter, for receiving the sampled voltage, and for generating digital output codes based on the calibration voltage output and the sampled voltage.

5. The analog-to-digital converter system of claim 4, further comprising a second multiplexer, connected to the digital-to-analog converter and the second analog-to-digital converter, for selectively transmitting the calibration voltage output to the second analog-to-digital converter.

6. The analog-to-digital converter system of claim 1, further comprising a lookup table for storing the first digital output codes in association with the digital code input.

7. The analog-to-digital converter system of claim 1, wherein the analog-to-digital converter includes circuits for converting voltages to delay signals, and for generating the first and second digital output codes based on the delay signals.

8. A lookup-table-based analog-to-digital converter system, comprising:
    a digital-to-analog converter having a digital code input and a calibration voltage output, the calibration voltage output based on the digital code input;
    a first analog-to-digital converter connected to the calibration voltage output and to a sampled voltage input, the first analog-to-digital converter operable to output first digital output codes based on the calibration voltage output and second digital output codes based on the sampled voltage input; and
    a lookup table, connected to the analog-to-digital converter, for storing the first digital output codes in association with the digital code input.

9. The lookup-table-based analog-to-digital converter system of claim 8, further comprising a first multiplexer, connected to the digital-to-analog converter and the analog-to-digital converter, for selectively transmitting one of the calibration voltage output and the sampled voltage input to the analog-to-digital converter.

10. The lookup-table-based analog-to-digital converter system of claim 9, further comprising a calibration controller, connected to the digital-to-analog converter and the first multiplexer, for transmitting the digital code input to the digital-to-analog converter, and for causing the multiplexer to transmit the calibration voltage output to the analog-to-digital converter while the digital code input is transmitted to the digital-to-analog converter.

11. The lookup-table-based analog-to-digital converter system of claim 10, further comprising a second analog-to-digital converter, connected to the digital-to-analog converter, for receiving the calibration voltage output from the digital-to-analog converter, for receiving the sampled voltage input, and for generating digital output codes based on the calibration voltage output and the sampled voltage input.

12. The lookup-table-based analog-to-digital converter system of claim 11, further comprising a second multiplexer, connected to the digital-to-analog converter and the second analog-to-digital converter, for selectively transmitting the calibration voltage output to the second analog-to-digital converter.

13. The lookup-table-based analog-to-digital converter system of claim 8, wherein the analog-to-digital converter includes circuits for converting voltages to delay signals, and for generating the first and second digital output codes based on the delay signals.

14. A method of calibrating an analog-to-digital converter system, comprising:

generating calibration voltages, by a digital-to-analog converter, based on digital input codes;

generating first digital output codes, by a first analog-to-digital converter, based on the calibration voltages;

generating second digital output codes, by the first analog-to-digital converter, based on sampled voltages; and storing the first digital output codes in association with the digital input codes in a lookup table.

15. The calibration method of claim 14, further comprising using a first multiplexer to selectively transmit one of the calibration voltages and the sampled voltages to the analog-to-digital converter.

16. The calibration method of claim 15, further comprising transmitting the digital input codes to the digital-to-analog converter, and transmitting the calibration voltages to the analog-to-digital converter while the digital input codes are transmitted to the digital-to-analog converter.

17. The calibration method of claim 16, further comprising causing a second analog-to-digital converter to receive the calibration voltages from the digital-to-analog converter, and to generate digital output codes based on the calibration voltages and the sampled voltages.

18. The calibration method of claim 14, wherein the analog-to-digital converter includes circuits for converting voltages to delay signals, and wherein the first and second digital output codes are generated based on the delay signals.

* * * * *